United States Patent [19]
Hadderman

[11] Patent Number: 5,805,473
[45] Date of Patent: Sep. 8, 1998

[54] PCMCIA VOLTAGE LOSS DETECTION

[75] Inventor: Scott Jeffrey Hadderman, Pleasant Valley, N.Y.

[73] Assignee: International Business Machines Corporation, Armonk, N.Y.

[21] Appl. No.: 521,498

[22] Filed: Aug. 30, 1995

[51] Int. Cl.⁶ .................................. G06F 1/00; G11C 7/00
[52] U.S. Cl. .......................... 364/707; 340/636; 365/226; 365/227; 395/182.2
[58] Field of Search ....................... 364/707; 395/182.12, 395/182.2, 182.21, 182.22; 365/189.07, 189.08, 189.09, 189.11, 222, 226, 227, 229, 203, 204; 307/31, 128–131, 48; 340/635, 636; 361/15, 18, 21, 56, 57

[56] References Cited

U.S. PATENT DOCUMENTS

| 5,072,103 | 12/1991 | Nara | 235/492 |
| 5,262,868 | 11/1993 | Kaneko et al. | 348/233 |
| 5,268,592 | 12/1993 | Bellamy et al. | 307/43 |
| 5,365,221 | 11/1994 | Fennell et al. | 340/636 |
| 5,375,051 | 12/1994 | Decker et al. | 363/49 |
| 5,430,681 | 7/1995 | Sugawara et al. | 365/222 |
| 5,469,096 | 11/1995 | Nessi et al. | 327/112 |
| 5,475,271 | 12/1995 | Shibasaki et al. | 307/31 |
| 5,514,995 | 5/1996 | Henning | 327/399 |
| 5,532,945 | 7/1996 | Robinson | 364/707 |
| 5,589,719 | 12/1996 | Fiset | 307/131 |

FOREIGN PATENT DOCUMENTS 61216010  9/1986  Japan .

Primary Examiner—Reba I. Elmore
Assistant Examiner—Emmanuel L. Moise
Attorney, Agent, or Firm—Marc A. Ehrlich; Lynn L. Augspurger

[57] ABSTRACT

A method and apparatus for detecting a supply voltage loss from a PCMCIA power source across a PCMCIA interface. The voltage loss may correspond for example, to the removal of a PCMCIA card from a PCMCIA host computer system. The invention provides for detection and reporting of said supply voltage loss to another apparatus capable of operating at lower voltage levels than that supplied by the PCMCIA power source. The rate of supply voltage loss is controlled, and an indication of the loss is provided to the other apparatus so as to allow sufficient time for the apparatus to take appropriate actions in response to the loss of supply voltage.

7 Claims, 6 Drawing Sheets

PCMCIA VOLTAGE LOSS DETECTION

FIELD OF THE INVENTION

This invention is generally related to computer systems and particularly to computer systems utilizing a PCMCIA SRAM interface for PCMCIA memory cards.

CROSS REFERENCE TO RELATED PATENTS

The present application related to the following patents:

PCMCIA SRAM Card Function Using DRAM Technology, U.S. Pat. No. 5,615,328 by Scott J. Hadderman and Kraig R. White A Method for PCMCIA SRAM Card Function Using DRAM Technology, U.S. Pat. No. 5,566,121 by Scott J. Hadderman and Kraig R. White These cross referenced patents and the present application are owned by one and the same assignee, International Business Machines Corporation of Armonk, N.Y.

The descriptions set forth in these cross referenced patents are hereby incorporated into the present application by this reference.

GLOSSARY OF TERMS

While dictionary meanings are also implied by certain terms used here, the following glossary of some terms may be useful.

| | |
|---|---|
| DRAM | Dynamic Random Access Memory. |
| SRAM | Static Random Access Memory. |
| PCMCIA | Personal Computer Memory Card International Association. |
| ASIC | Application Specific Integrated Circuit. |
| Host Computer System | Computer to which the PCMCIA memory card is currently attached. |

REFERENCES USED IN THE DISCUSSION OF THE INVENTION

During the detailed description which follows the following work will be referenced as an aid for the reader. The additional reference is:

PCMCIA PC CARD STANDARD Release 2.1 Personal Computer Memory Card International Association 1030 East Duane Avenue Suite G Sunnyvale, Calif. 94086

This additional reference is incorporated by reference.

BACKGROUND OF THE INVENTION

The PCMCIA specification was created to standardize a removable peripheral device for personal computers. The PCMCIA specification describes the features required for PCMCIA devices. These features include physical dimensions and electrical specifications. The PCMCIA electrical specification can further be divided into two card categories, input/output cards and memory cards. This invention is described by the memory card category of the PCMCIA specification.

Although the memory specification is intended to describe PCMCIA devices using general memory technology, the specification tends to limit memory selection to either SRAM or FLASH technology. The specification is not well suited to other types of memory, particularly DRAM. Signals and functions unique to DRAM technology, such as refresh, are not readily addressed by the PCMCIA specification.

The purpose of this invention is to allow the use of DRAM technology in a PCMCIA device. This will allow the user to take advantage of DRAM technology's inherent benefits. These include higher density, lower cost, and improved data integrity.

This invention not only allows DRAM to function in a PCMCIA device, but it also handles any peculiarities of DRAM technology. To the user, the invention will appear as an SRAM device.

The invention must perform several functions in order to replace a PCMCIA SRAM based memory card. It must manage the power obtained from its host system and properly regulate it to the DRAM. It must communicate through PCMCIA signals and translate SRAM protocols to DRAM protocols. At the same time, the invention must refresh the DRAM and handle any refresh/PCMCIA access contention. When the invention is removed from its host computer system, the invention must detect the removal, force the DRAM into its data retention mode, modify the DRAM voltages to facilitate the data retention mode, and switch the source of the power supply from the host computer system to an alternate supply i.e. battery. When the invention is returned to a host, it must switch its power source from the alternate supply to the host, adjust the DRAM voltage to its operating voltage, and force the DRAM out of data-retention mode into an active mode. All of these functions will be independent of any user intervention.

Previous inventions have addressed the problem of configuring a DRAM device to function as an SRAM device. Each of these inventions have failed to address the further inventive steps associated with providing the associated power management as well as the control of the DRAM operations including data retention operations required for use of a DRAM component on a PCMCIA card. For example, U.S. Pat. No. 5,276,843, issued Jan. 1, 1994 to Tillinghast et al., discusses the concept of configuring a DRAM to appear to function as a SRAM. This patent fails to address the problems inherent in operating a DRAM in a PCMCIA SRAM environment. The present invention provides complex power management functions as well as data retention operation of the DRAM which permit the DRAM to function on a PCMCIA card. These problems are not addressed by this patent. Furthermore, U.S. Pat. No. 4,958,322, issued Sep. 18, 1990 to Kosugi et al., describes a module containing DRAMs which is configured to appear as an SRAM module through the use of external logic. This patent does not address any of the problems inherent in a PCMCIA based DRAM invention. Additionally, the patent requires the use of external signals for refreshing the DRAM, these signals would not be available to the DRAM in a PCMCIA implementation.

Other inventions have addressed the concept of power loss detection, however, these inventions have failed to solve the particular problems encountered in providing such detection as a step in the overall power management of a DRAM in a PCMCIA based implementation. For example, U.S. Pat. No. 5,365,221, issued Nov. 15, 1994 to Fennell et al., teaches a low battery detection circuit coupled with an annunciator which generates a sensible audible alert. U.S. Pat. No. 5,072,103, issued Dec. 10, 1991 to Nara et al., teaches a low battery voltage detection device which strives to reduce its own power consumption so as to prolong battery life. U.S. Pat. No. 5,262,868, issued Nov. 16, 1993 to Kaneko et al., consists of a load dependent low battery voltage detection circuit and an alarm notifier. None of these inventions address the problems inherent in managing power to a DRAM in a PCMCIA implementation. In particular, these inventions do not solve the problems inherent in providing sufficient time after a voltage loss is detected so as to allow the associated circuitry to compensate for the loss ensuring the data integrity of the DRAM device.

SUMMARY OF THE INVENTION

This invention provides for the use of DRAM in the PCMCIA environment. The current PCMCIA memory specification is designed for use with SRAM technologies. This invention creates a memory card that appears to the system as SRAM but capitalizes on the beneficial features of DRAM technology i.e. greater density, lower cost and higher data integrity.

These improvements are accomplished by providing circuits which allow DRAM to emulate SRAM in a PCMCIA environment. This emulation involves translation of signals from the PCMCIA interface to DRAM control signals and the ability to refresh the DRAM, and to arbitrate the DRAM resources between these functions. In addition, these circuits handle the particular needs of the DRAM to allow it to function in a PCMCIA environment, including the maintenance of supply voltage to the DRAM.

In order to provide for the use of DRAM technology in a PCMCIA environment the invention provides an apparatus and method for detecting and reporting a supply voltage loss from a PCMCIA power source to another apparatus in such a manner that the other apparatus has adequate time to respond to the voltage loss, thereby maintaining a source of voltage for the DRAM device.

Our detailed description explains the preferred embodiments of our invention, together with advantages and features, by way of example with reference to the following drawings.

DETAILED DESCRIPTION OF THE INVENTION

Figure 1:
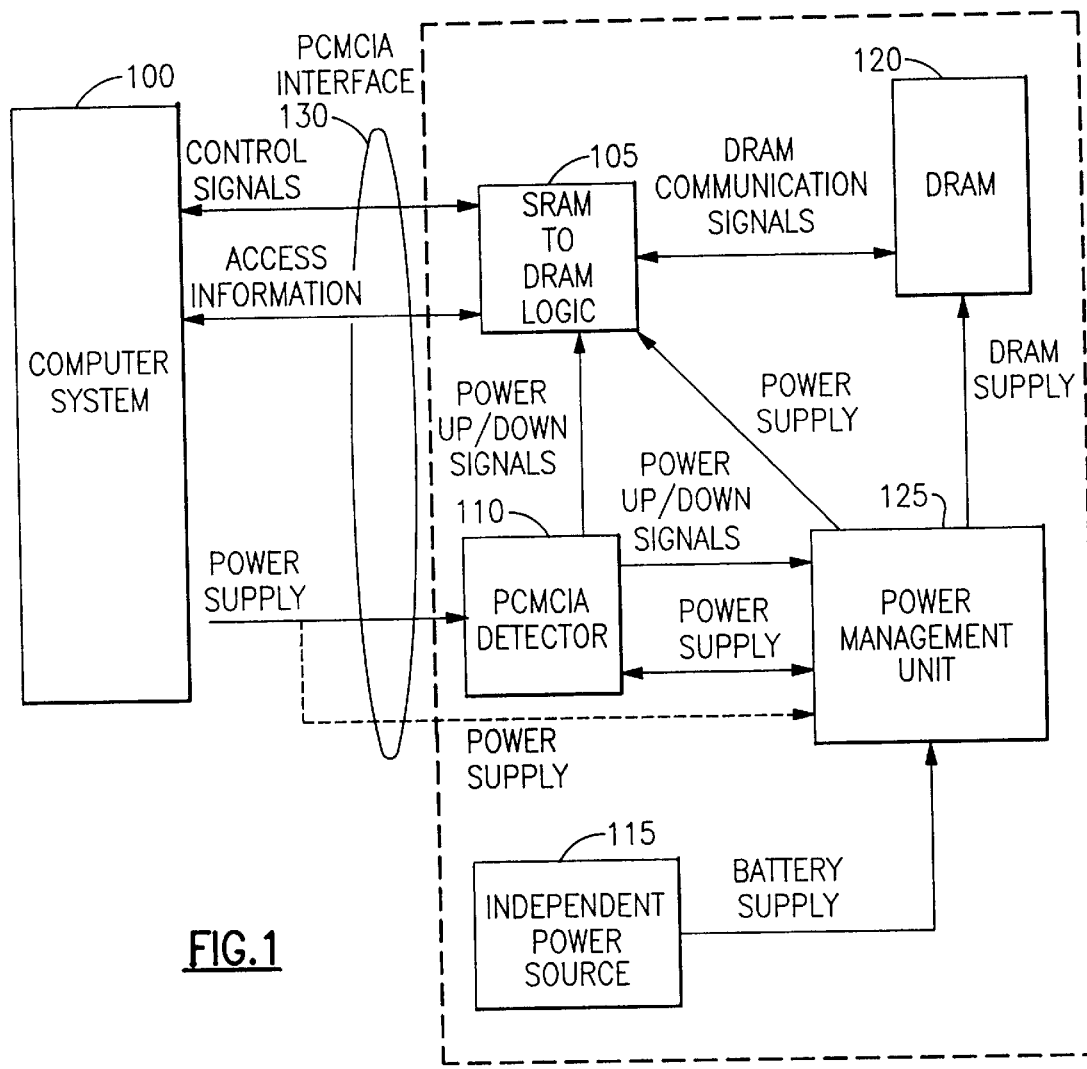
FIG. 1 shows a schematic overview of the preferred embodiment.

The purpose of this invention is to duplicate the function of a PCMCIA SRAM card using DRAM technology. By utilizing DRAM technology, the PCMCIA SRAM equivalent card can be fabricated more cost effectively, provide greater storage capacity, and achieve higher data integrity than a card utilizing SRAM technology. These advantages are a function of the inherent lower cost, higher density and greater data integrity of DRAM technology as opposed to SRAM technology.

To use DRAM in the PCMCIA environment, five major tasks have to be performed. First, the dynamic refresh of the DRAM has to be handled independent from the host computer system. Second, the invention must detect a loss of a PCMCIA supply voltage provided by a host computer system, which may correspond to the removal of the invention from the host computer system, as well as detecting the rise of PCMCIA supply voltage, which may correspond to returning the invention to a host computer system. Third, power to the DRAM has to be carefully maintained while the invention is connected and removed from a host computer system in order to prevent the loss or corruption of the data stored therein. Fourth, the DRAM has to be forced into data-retention mode upon the detection of supply voltage loss from the host computer and must be forced out of data-retention mode upon the recovery of supply voltage from the host computer system. Fifth, SRAM control signals generated by the host computer system and sent across the PCMCIA interface must be translated into signals which will properly control the DRAM, and the communication of these control signals must be arbitrated with the provision of DRAM refresh cycles.

The refresh of the DRAM is handled by SRAM to DRAM interface logic which may be implemented via discrete logic components or in an ASIC as in a preferred embodiment of the invention. This ASIC, at the proper time interval, will refresh the DRAM. If the host computer generates a PCMCIA access request associated with this DRAM while the refresh is taking place, the ASIC will suspend the access until the refresh is completed.

PCMCIA cards are designed to be easily removed from a host computer system, thus in order to maintain power to the DRAM, the invention must rely on a separate power source in addition to the supply voltage provided by the host computer system. Accordingly, the invention will detect when the supply voltage provided by the host computer system has fallen below a predetermined level which may indicate that the host computer is no longer a reliable power source. This level could for example be 4.75 volts (the lower limit of the PCMCIA specification). The loss in supply voltage from the host computer system might indicate that the card has been removed from the host computer system or that the host computer system has lost power. As a result of this detection the invention will generate a power down signal to communicate the impending loss of voltage and initiate the appropriate functions associated with the loss. Likewise, the invention will detect that the supply voltage provided by the host computer system has risen above the predetermined level which may indicate the presence of a reliable power source. As a result, the invention will generate a power up signal, and initiate the appropriate functions associated with the return of computer system supply voltage.

Because DRAM technology requires tight tolerances for input voltage supply, the invention's power supply manager must maintain control of the power supply voltage provided to the DRAM. The power supply manager must convert the PCMCIA supply voltage into a voltage compatible with the DRAM device. When the power down signal is generated, the power manager will switch the power supply source from the host computer system to a power source operating independently from the host computer system. In a preferred embodiment of the invention this power source is a battery included on the PCMCIA card. When the power up signal is generated, the power manager will switch the source of power supply voltage to the host computer, thereby conserving battery life.

When the power down signal is generated, the DRAM must be forced into a data-retention mode. The SRAM to DRAM logic interface will finish any DRAM processes, and force the DRAM into data-retention mode. When the power up signal is generated, the SRAM to DRAM logic interface will force the DRAM out of data-retention mode to permit communication between the DRAM and the host computer system.

The SRAM to DRAM logic interface uses combinatorial and state logic to manage SRAM to DRAM interaction. PCMCIA SRAM access requests from the host computer system are monitored to detect when such a request is associated with the DRAM device of the invention. The SRAM to DRAM logic contains an arbiter which determines whether the PCMCIA SRAM request for access to the DRAM occurrs before or after a DRAM refresh cycle is required, and arbitrates between these two functions based on which occurrs first in time. The PCMCIA SRAM access request consists of SRAM control signals and access information such as address and data. The SRAM control signals are converted to DRAM control signals which, along with the access information, are directed to the DRAM. All control signals as well as the access information are processed by the invention's SRAM to DRAM logic interface. This allows the invention to synchronize the DRAM's timings with the SRAM timings that it is emulating.

THE PREFERRED EMBODIMENT

Turning now to our invention in greater detail, FIG. 1 illustrates our preferred embodiment in which the host computer system (100) is linked to the invention via a PCMCIA interface (130). For clarity, the PCMCIA interface signals can be divided into control signals, access information, and a power supply signal. The PCMCIA control signals and access information interface with the SRAM to DRAM logic (105). The PCMCIA power supply drives both the PCMCIA detector (110) and the power manager (125). In a preferred embodiment of the invention, the power manager (125) receives the PCMCIA power supply through the PCMCIA detector (110) which manipulates the voltage level of the PCMCIA supply.

Figure 2:
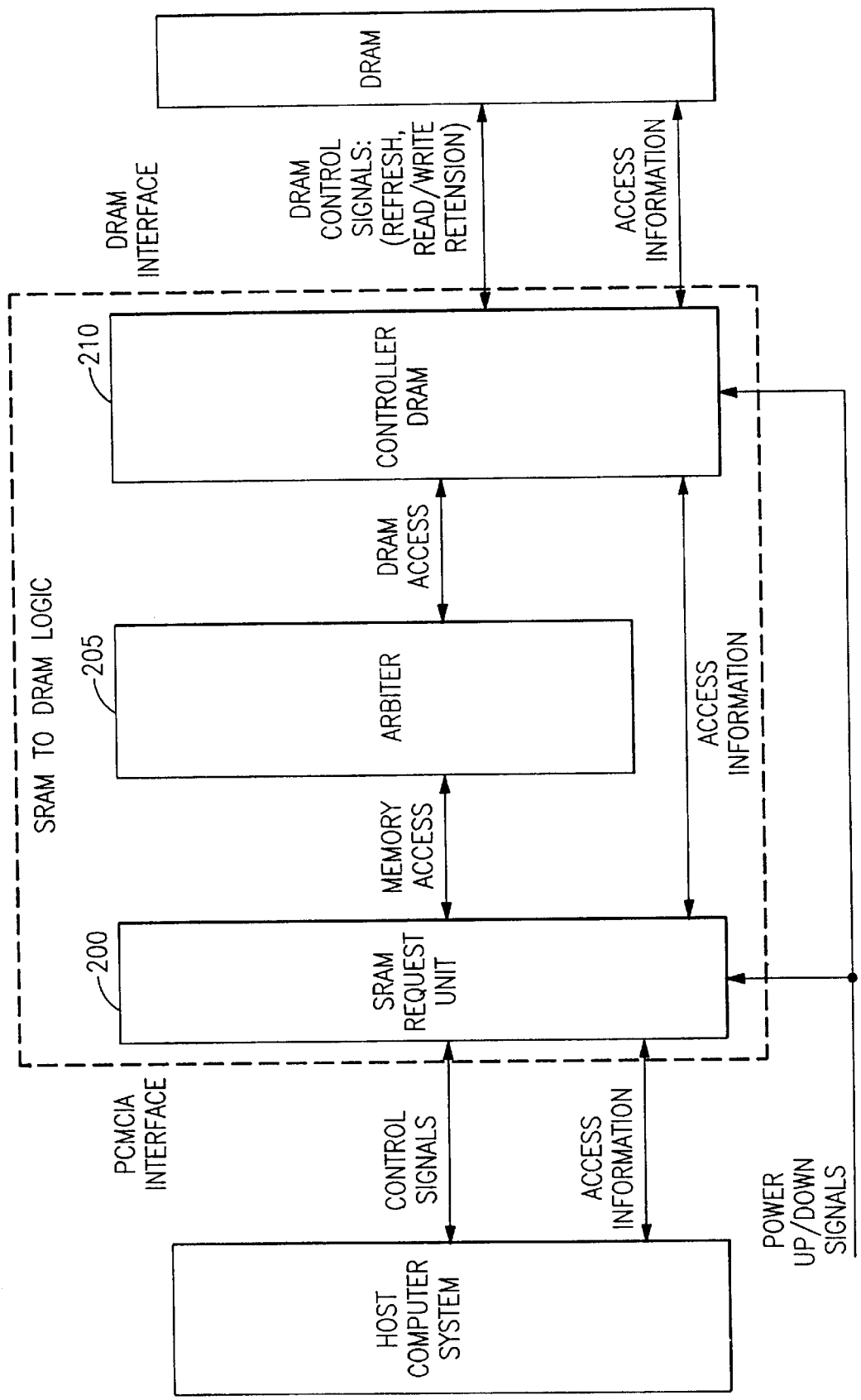
FIG. 2 shows the functional blocks of the SRAM to DRAM logic interface.

The function of the SRAM to DRAM logic is shown in FIG. 2. The SRAM to DRAM logic (105) contains the arbiter (205), the DRAM control unit (210), and the SRAM request interface (200). All control signals and access information from the host computer system (100) across the PCMCIA interface (130) are monitored by the SRAM request interface (200). When a PCMCIA SRAM request corresponding to the DRAM is received by the SRAM request interface, an indication is forwarded to the arbiter (205). The arbiter communicates with the DRAM control unit (210). The DRAM control unit is connected to the DRAM device (120) and functions to refresh the DRAM as needed, to communicate control signals and access information to the DRAM, and to force the DRAM into and out of data-retention mode. If the DRAM control unit is not busy (i.e. refreshing the DRAM), a communication of the receipt of a PCMCIA SRAM request is sent from the arbiter to the DRAM control unit. The DRAM control unit, in turn, accesses the DRAM, by generating DRAM control signals and directing these signals along with the access information from the SRAM request interface to the DRAM device.

In the absence of a power down signal, the DRAM control unit monitors time. After a particular time period has elapsed, the DRAM control unit will refresh the DRAM. Any PCMCIA SRAM requests for the DRAM received while the DRAM is being refreshed will be suspended by the arbiter using the WAIT control line of the PCMCIA interface.

Referring back to FIG. 1, the PCMCIA detector (110) monitors the power supply from the PCMCIA interface. When it determines that the supply voltage provided by the host computer system across the PCMCIA interface has fallen below a predetermined level corresponding to the lower limit of the PCMCIA specification (i.e. 4.75 v), it sends a power down signal to both the SRAM to DRAM logic (105) and the power manager (125).

When the SRAM to DRAM logic receives the power down signal, the DRAM controller (210) completes any pending communications between the DRAM device and the computer system, the SRAM request interface (200) quiesces the PCMCIA interface, and finally, the DRAM controller forces the DRAM device into data-retention mode.

In a preferred embodiment of the invention, the DRAM device is capable of operating at a certain voltage level during normal operations, and at a lower voltage level after it has been forced into data-retention mode. An example of such a low-power DRAM device is IBM part number IBM0116160PT3-70, manufactured by IBM Corporation. This low-power DRAM device operates at 3.3 volts during normal operation and as low as 2.7 volts while in data-retention mode.

While the invention is receiving voltage above the predetermined level from the host computer system, the power manager directs voltage provided by the host computer system (100) to the DRAM (120) and to the SRAM to DRAM logic (105). If the power manager receives a power down signal from the PCMCIA detector, it will maintain the DRAM voltage while the DRAM is forced into data-retention mode. Next, it will slew the DRAM voltage down to a level compatible operating voltage level of the independent power source which is between 3.3 to 2.7 volts. Finally, it will switch the power source for the invention from the host system to the independent power source (115).

Figure 3:
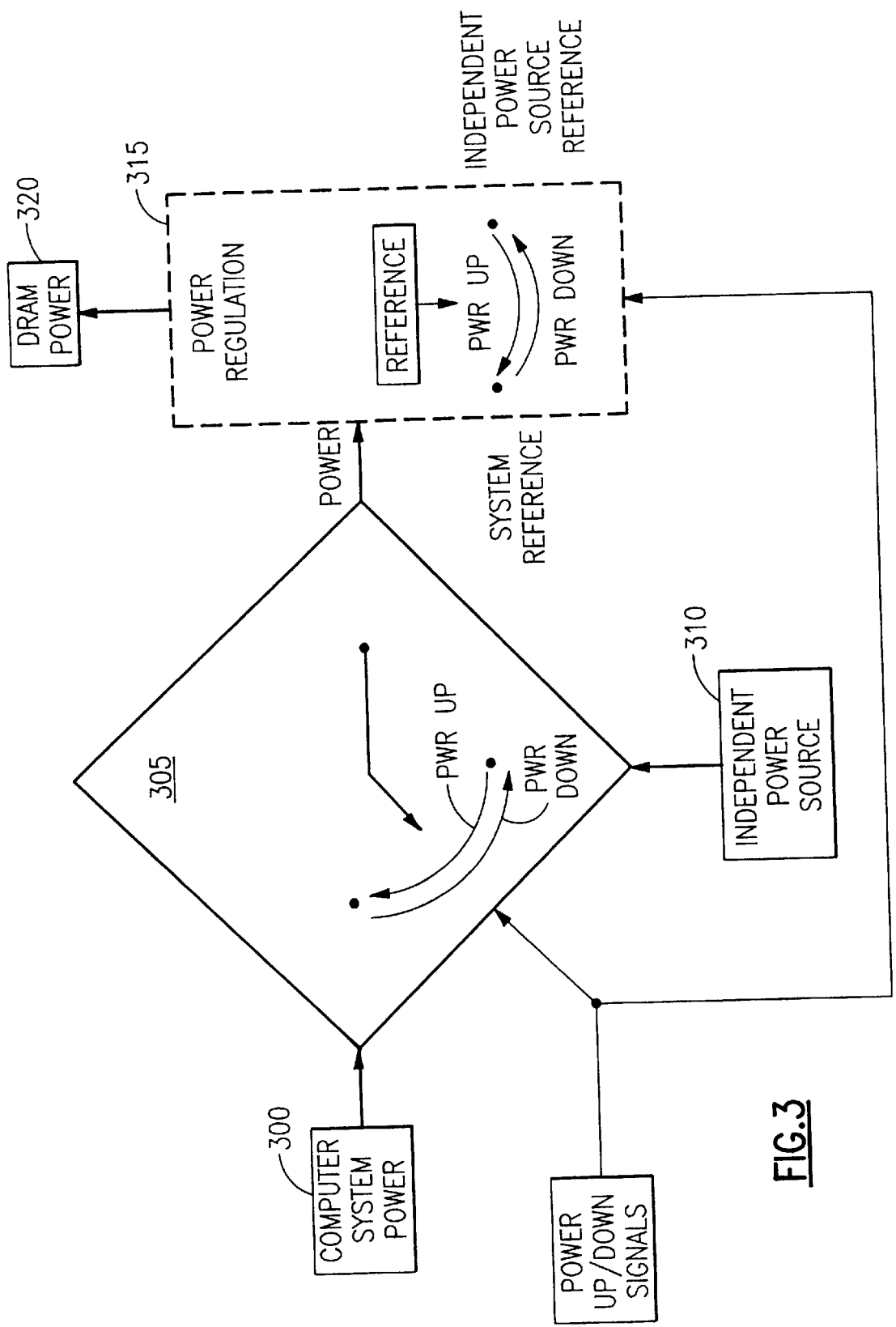
FIG. 3 shows the details of the power manager.

FIG. 3 shows the power manager circuit responding to the power detect signals from the PCMCIA detector by switching the source of supply voltage from the host computer system (300) to the independent power source (310) on a power down detect signal and from the independent power source to the host computer system power on a power up detect signal. FIG. 3 further illustrates the aforementioned power regulation feature of the power manager (315). The power manager responds to the power down detect signal by slewing the voltage provided to the DRAM from a system reference level corresponding to the operation of the DRAM when it is not in data-retention mode, down to the operating level of the independent power source, upon a power up detect signal the power manager slews the DRAM voltage from the independent power source level to the normal operating (i.e. reference) level of the DRAM.

After the invention has detected a power loss and has responded to the power down signal, the DRAM will continue to operate in data-retention mode, using the independent power source as its source of supply voltage, operating at the lower operating voltage of the independent power source. Operation via the independent power source will continue until the supply voltage from the host computer system rises above the predetermined level, which may indicate that the invention has been reattached to the host computer system. Upon detecting the return of the supply voltage from the host computer system, the PCMCIA detector will send a power up signal to both the SRAM to DRAM logic and the power manager. In response, the SRAM to DRAM logic will force the DRAM out of data retention mode so that communication between the DRAM and the host computer system may resume. The power manager will respond to the signal by switching the source of supply voltage back to the host computer system and then slewing the supply voltage to the DRAM back to its normal operating voltage, thereby preserving the life of the independent power source.

Figure 4:
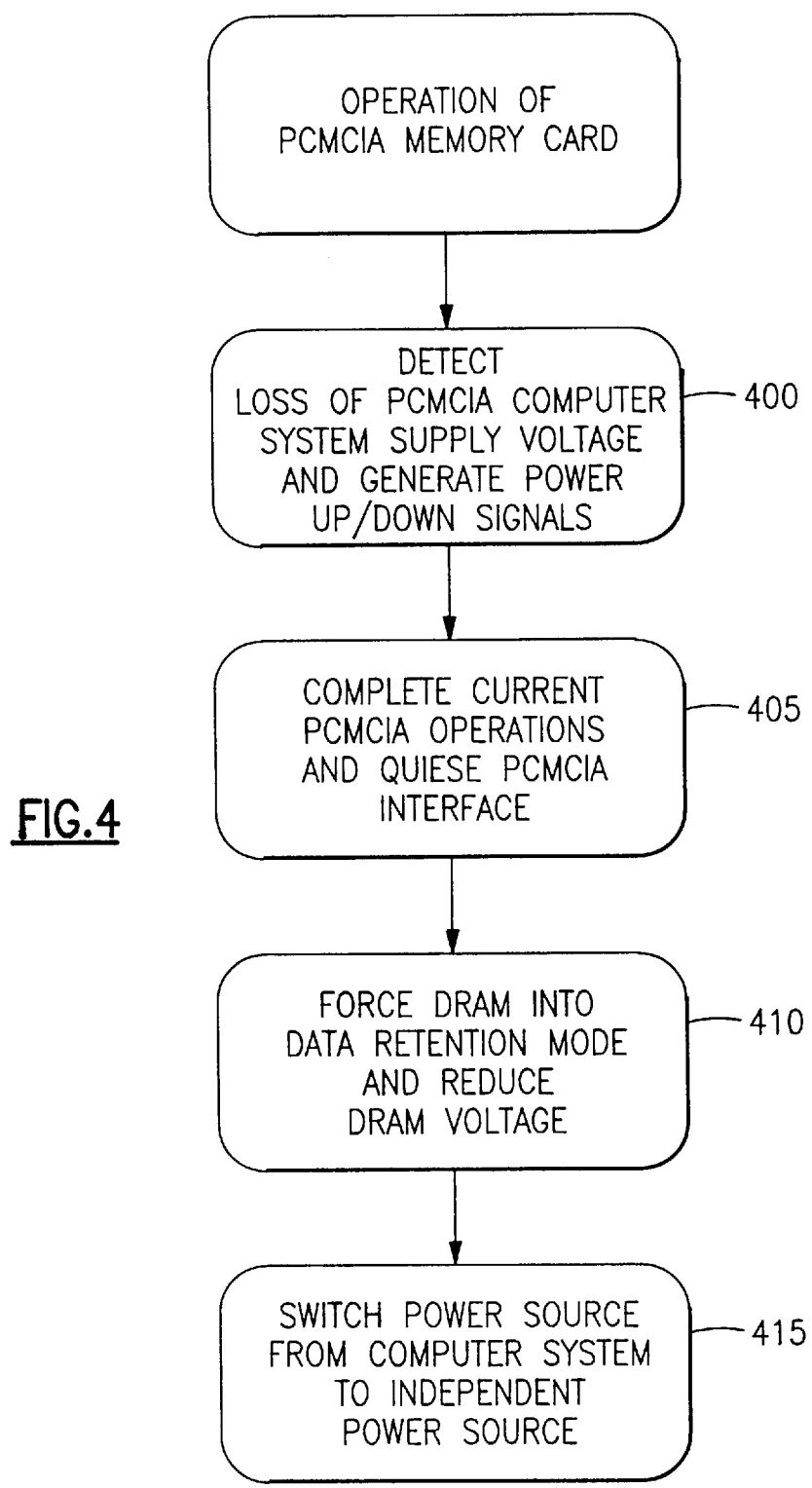
FIG. 4 shows the sequence of events occurring when the voltage provided by the host computer system falls below a predetermined level.

FIG. 4 outlines the events which occur as the invention detects that the voltage provided by the computer system has fallen below the predetermined level. As the voltage falls, the PCMCIA detector will signal the voltage loss via a power down detect signal (400). Upon receiving this signal, the SRAM to DRAM logic will cause any pending communications across the PCMCIA interface to complete, it will then quiesce the PCMCIA interface (405). Next, the SRAM to DRAM logic will force the DRAM into data-retention mode and the power manager will reduce the voltage supplied to the DRAM to the voltage level of the independent power source (415). Finally, the power manager will switch the source of supply voltage from the computer system to the independent power source (415).

Figure 5:
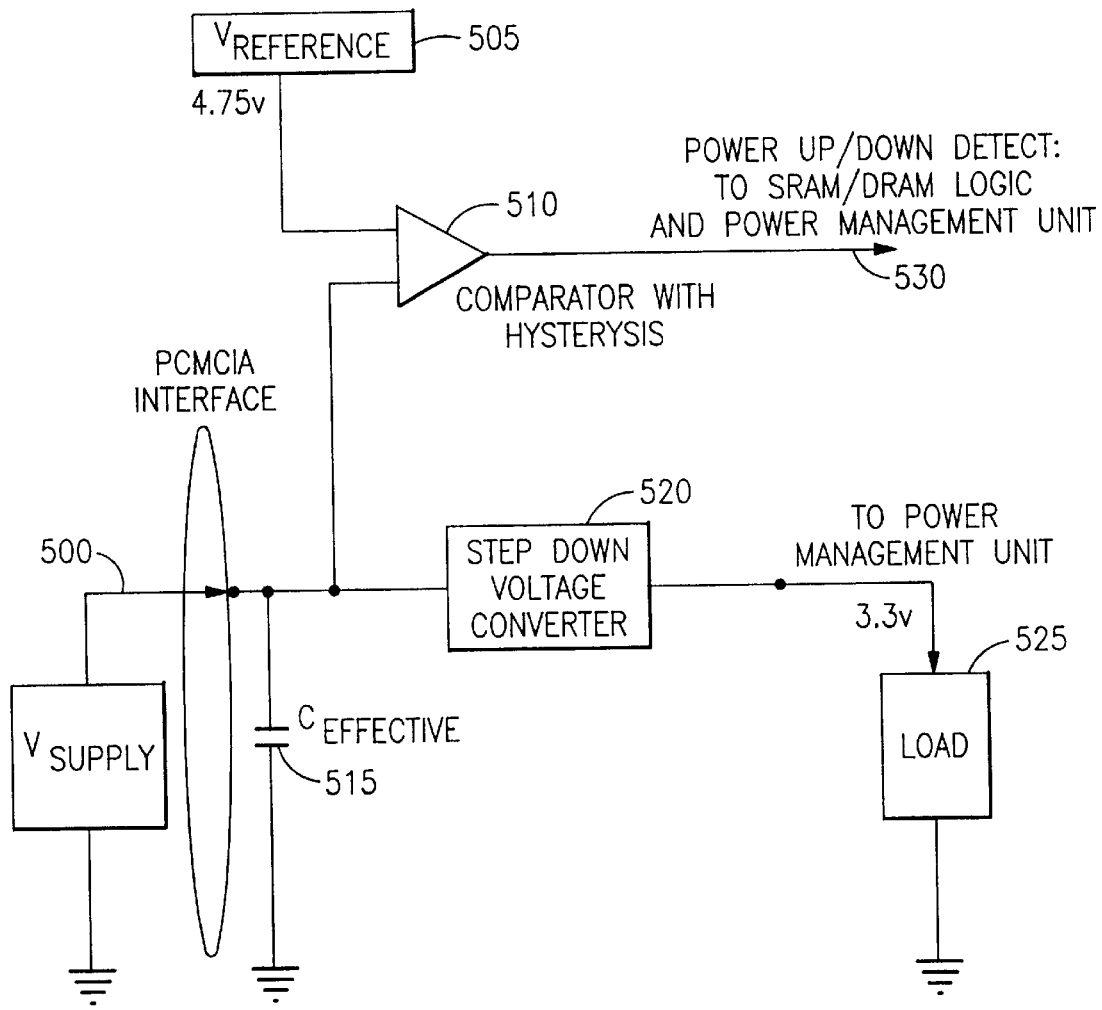
FIG. 5 shows the details of the PCMCIA detection circuit.

FIG. 5 shows the details of the PCMCIA detector. During normal operation, power is supplied by the host computer system across the PCMCIA interface (130). The incoming power, in accordance with the PCMCIA specification, is provided at 5 volts. Industry standard components including DRAMs and ASICs with operating voltages lower than 5 volts (i.e. 3.3 volts) are common. The invention utilizes such components so that the SRAM to DRAM logic and the DRAM device are able to operate at a voltage lower than 5 volts (i.e. 3.3 volts), thus in a preferred embodiment, a step down converter (520) is included in the PCMCIA detector to lower the voltage level provided to the power manager (note that where the power manager receives voltage directly from the computer system, the step down converter may be included in the power manager).

The voltage level of the supply voltage from the host computer system is monitored in the PCMCIA detector by a comparator (510) and compared to a predetermined reference voltage level (505). The predetermined reference voltage level in a preferred embodiment of this invention is the lower limit of the PCMCIA specification (i.e. 4.75 volts). A voltage below this value would indicate that voltage is no longer being reliably supplied by the host computer system.

When the voltage supplied by the host computer system across the PCMCIA interface (500) begins to drop, power continues to be supplied to the components by a storage capacitor (515). As the voltage from the storage capacitor falls below the predetermined reference voltage level, the comparator will generate the power down detect signal (530) indicating that the voltage has fallen below the predetermined reference voltage. This signal indicates that reliable power is no longer available from the host computer system. The power down detect signal is sent to both the SRAM to DRAM logic and to the power manager. The SRAM to DRAM logic in turn causes all pending communication between the host computer system and the DRAM to complete, then quiesces the PCMCIA interface and finally forces the DRAM into its data-retention mode. Because the SRAM to DRAM logic is able to function at a lower voltage than the 5 volt supply coming from the host computer system (i.e. 3.3 v) it can continue to function even though the incoming voltage is now less than 4.75 v. The power manager, as illustrated in FIG. 3 will respond to the power down signal in turn by slewing the voltage level of the supply voltage provided from the host computer system down to the level of the independent power source (i.e. between 3.3 to 2.7 volts) (315). Once the voltage has been slewed to this lower level, the power manager will switch the source of the supply voltage from the host computer system to the independent power source (305).

The comparator of the PCMCIA detector will likewise generate a power up detect signal when the voltage supplied by the computer system across the PCMCIA interface rises above the predetermined voltage level (505). Such a return of supply voltage from the computer system could for example, indicate that the invention has been re-attached to the host computer system. In FIG. 3, this power up detect signal is sent to the power manager for switching the source of the power supply from the independent power source to the computer system (305) and then, slewing the voltage directed to the DRAM from the host computer system up to the DRAM's normal operating voltage (i.e. 3.3 volts) to conserve the life of the independent power source (315). The power up detect signal is likewise communicated to the SRAM to DRAM logic (105) which in turn will force the DRAM device out of data-retention mode to permit communication between the host computer system and the DRAM.

Figure 6:
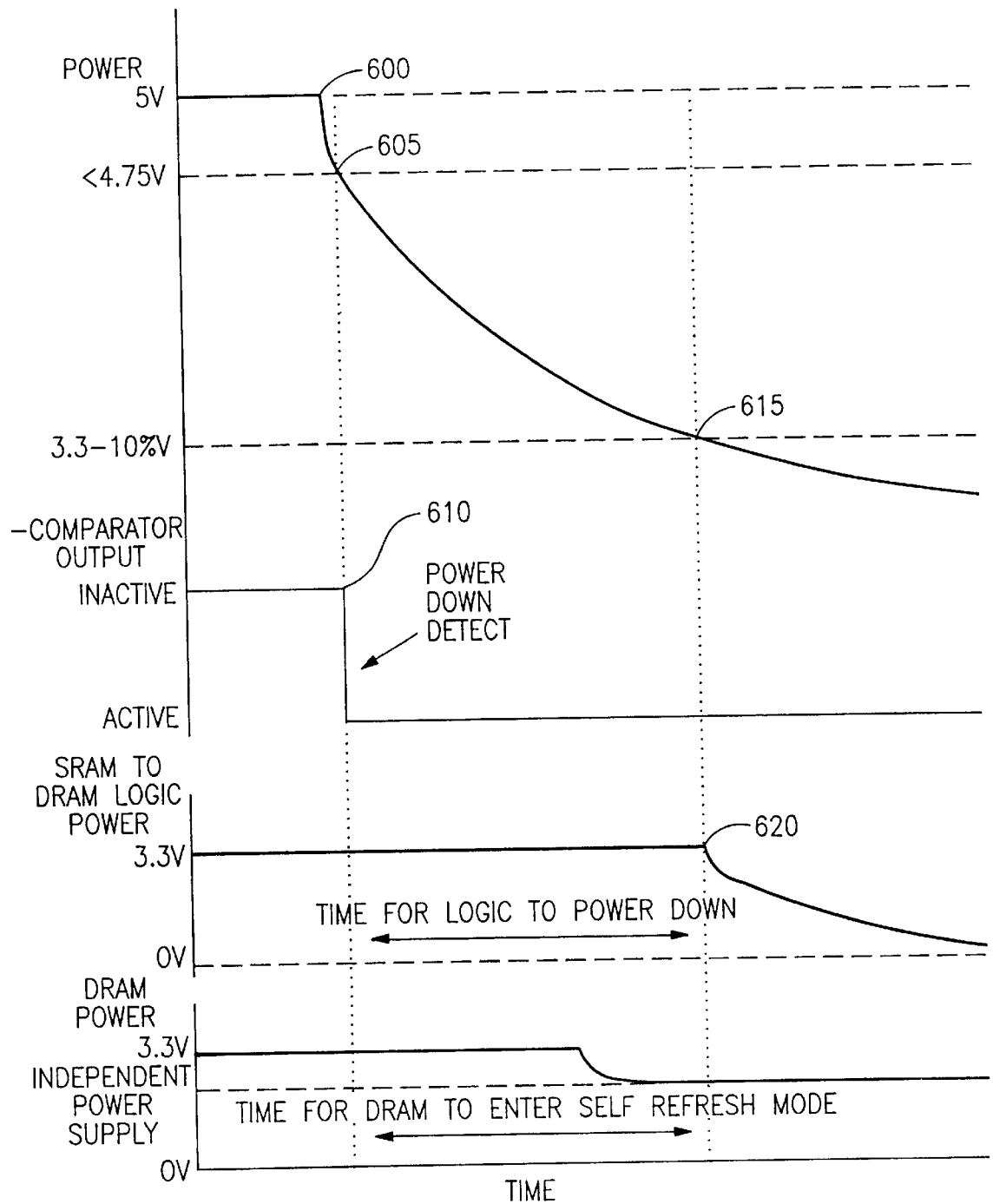
FIG. 6 shows the time detail of the PCMCIA detection circuit.

FIG. 6 shows these events in time. The voltage supplied by the computer system (600) begins to fall. As the voltage falls below a predetermined voltage level (605) (i.e. 4.75 v), the comparator signals the voltage drop (610). Voltage continues to fall but the step down converter continues to convert this voltage into a stable voltage of 3.3 v. The SRAM to DRAM logic can continue to function until the supply voltage falls to 3.3 v −10% (the lower limit of the ASIC specification) (615). Likewise, the DRAM receives the converted voltage of 3.3 volts from the power manager, once the DRAM has been forced into data retention mode by the SRAM to DRAM logic, the power manager will slew the DRAM voltage to the level of the independent power source.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. An apparatus for use with a computer system having a PCMCIA interface, said apparatus removably coupled to said computer system for detecting and reporting a loss in a supply voltage from a PCMCIA power source across said PCMCIA interface to another apparatus capable of operating at a lower voltage level than a normal voltage level for said PCMCIA power source, said apparatus providing a first operating supply voltage to said other apparatus and initiating the provision of an alternate lower operating voltage to said other apparatus from an alternate power source in response to said loss of said supply voltage from said PCMCIA power source, said apparatus comprising:

a rate controller removably coupled to said PCMCIA interface for receiving said supply voltage from said PCMCIA power source across said PCMCIA interface and for providing a controlled reduction of a supplemental supply voltage to a comparator, by storing the supplemental supply voltage and by providing to said comparator successively declining voltage levels of said stored supplemental supply voltage in response to said loss of said supply voltage, said rate controller providing said first operating supply voltage to said other apparatus for a period of time in response to said loss of said supply voltage, said controlled reduction of said supplemental supply voltage extending the period of time during which the first operating supply voltage is provided to said other apparatus in response to said loss of said supply voltage; and said comparator coupled to said rate controller for receiving and comparing said successively declining voltage levels of said stored supplemental supply voltage from said rate controller to a predetermined reference voltage, and for generating an indication if one of said received successively declining voltage levels from said rate controller is below said predetermined reference voltage said indication signalling the loss of the supply voltage from said PCMCIA power source and initiating a sequence of operations for the provision of the alternate lower operating voltage to said other apparatus from said alternate power source;

wherein the extending of the period of time during which the first operating supply voltage is provided to said other apparatus by said rate controller in response to said loss of said supply voltage provides time for the performance of said sequence of operations.

2. The apparatus according to claim 1 wherein said predetermined reference voltage is equal to the lower limit of a PCMCIA safe voltage level allowed for operation of said PCMCIA interface.

3. The apparatus according to claim 1 wherein said rate controller includes a capacitor.

4. An apparatus according to claim 1 wherein said apparatus further includes a power converter coupled to said rate controller, for converting said successively declining voltage levels from said rate controller to said first operating supply voltage for said other apparatus, said successively declining voltage levels being at least equal to a level of said first operating supply voltage and for providing voltage at said first operating supply voltage level to said other apparatus.

5. An apparatus for use with a computer system having a PCMCIA interface, said apparatus removably coupled to said computer system for detecting and reporting a loss in a supply voltage from a PCMCIA power source across said PCMCIA interface to another apparatus capable of operating at a lower voltage level than a normal voltage level for said PCMCIA power source, said apparatus providing a first operating supply voltage to said other apparatus and initiating the provision of an alternate lower operating voltage to said other apparatus from an alternate power source in response to said loss of said supply voltage from said PCMCIA power source, said apparatus comprising:

a rate controller removably coupled to said PCMCIA interface for receiving said supply voltage from said PCMCIA power source across said PCMCIA interface and for providing a controlled reduction of a supplemental supply voltage to a comparator, by storing the supplemental supply voltage and by providing to said comparator, successively declining voltage levels of said stored supplemental supply voltage in response to said loss of said supply voltage, said controlled reduction of said supplemental supply voltage extending a period of time during which the first operating supply voltage is provided to said other apparatus in response to said loss of said supply voltage;

said comparator coupled to said rate controller for receiving and comparing said successively declining voltage levels of said stored supplemental supply voltage from said rate controller to a predetermined reference voltage, and for generating an indication if one of said received successively declining voltage levels from said rate controller is below said predetermined reference voltage said indication signalling the loss of the supply voltage from said PCMCIA power source and initiating a sequence of operations for the provision of the alternate lower operating voltage to said other apparatus from said alternate power source; and a power manager coupled to said rate controller for receiving said successively declining voltage levels of the supplemental supply voltage, said power manager converting said received successively declining voltage levels to said first operating supply voltage for said other apparatus and for providing voltage at a level for said first operating supply voltage to said other apparatus, said first operating supply voltage level being greater than a level of said alternate lower operating voltage.

6. An apparatus according to claim 5 wherein said power manager is further coupled to said comparator for receiving said indication, said power manager gradually lowering the voltage provided to the other apparatus from said first operating supply voltage level to the level of the alternate lower operating voltage in response to said received indication.

7. An apparatus according to claim 6 wherein said power manager switches the source for the voltage provided to the other apparatus to said alternate power supply in response to said received indication from the comparator prior to when the successively declining voltage levels received by the power manager decline below the level of the alternate lower operating voltage.

\* \* \* \* \*